(12) United States Patent
Cho et al.

(10) Patent No.: US 9,196,804 B2
(45) Date of Patent: Nov. 24, 2015

(54) DISPLAY APPARATUS

(71) Applicant: Samsung Display Co., Ltd., Yongin, Gyeonggi-Do (KR)

(72) Inventors: Sung-Ho Cho, Yongin (KR); Ji-Yong Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/186,684

(22) Filed: Feb. 21, 2014

(65) Prior Publication Data

US 2015/0102293 A1  Apr. 16, 2015

(30) Foreign Application Priority Data

Oct. 14, 2013 (KR) .......................... 10-2013-0122220

(51) Int. Cl.
*H01L 33/56* (2010.01)
*H01L 51/52* (2006.01)
*H01L 29/786* (2006.01)

(52) U.S. Cl.
CPC .............. *H01L 33/56* (2013.01); *H01L 29/786* (2013.01); *H01L 51/5237* (2013.01)

(58) Field of Classification Search
CPC ........ H01L 33/56; H01L 51/52; H01L 29/786

USPC ..................... 257/40; 313/506, 512
See application file for complete search history.

(56) References Cited

U.S. PATENT DOCUMENTS

| 7,538,488 | B2 * | 5/2009 | Kwak ........................... 313/506 |
| 8,067,883 | B2 | 11/2011 | Wang |
| 2005/0184927 | A1 | 8/2005 | Kwak |
| 2007/0013862 | A1 * | 1/2007 | Tashiro et al. ................. 349/187 |
| 2012/0002145 | A1 | 1/2012 | Lee et al. |
| 2013/0003006 | A1 | 1/2013 | Wang et al. |

FOREIGN PATENT DOCUMENTS

| KR | 10-2005-0082260 A | 8/2005 |
| KR | 10-2009-0041613 A | 4/2009 |
| KR | 10-2012-0139075 A | 12/2012 |

* cited by examiner

*Primary Examiner* — Sheng Zhu
(74) *Attorney, Agent, or Firm* — Knobbe Martens Olson & Bear LLP

(57) ABSTRACT

A display apparatus which can be uniformly sealed by an inhomogeneous laser beam is disclosed. One inventive aspect includes a display substrate, an encapsulation substrate and a sealing portion. On the display substrate, a display unit, including a display device, is formed. The encapsulation substrate is formed to face the display substrate. The sealing portion is formed to surround the display unit and bond the display substrate and the encapsulation substrate to each other.

20 Claims, 11 Drawing Sheets

DISPLAY APPARATUS

CROSS-REFERENCE TO RELATED APPLICATIONS

This application claims the benefit of Korean Patent Application No. 10-2013-0122220, filed on Oct. 14, 2013, in the Korean Intellectual Property Office, the disclosure of which is incorporated herein in its entirety by reference.

BACKGROUND

1. Field

The disclosed technology generally relates to a display apparatus which can be uniformly sealed by an inhomogeneous laser beam.

2. Description of the Related Technology

In general, display apparatuses such as organic light emitting display (OLED) apparatuses, including a thin film transistor and liquid crystal displays, are used for displays for mobile devices such as digital cameras, video cameras, camcorders, portable information terminals, and smartphones.

Such a display apparatus typically has to be sealed so as to protect display devices from outside. To do this, a sealing material is applied between a plurality of substrates, and a laser beam is irradiated onto the sealing material to bond the substrates to each other.

When the substrates are sealed by the laser beam, they may be bonded non-uniformly due to inhomogeneous energy or heat between a center portion and a peripheral portion of a sealing portion and partially based on the profile of the laser beam.

SUMMARY OF CERTAIN INVENTIVE ASPECTS

One or more embodiments of the disclosed technology include a display apparatus.

Additional aspects will be set forth in part in the description which follows and, in part, will be apparent from the description, or may be learned by practice of the presented embodiments.

According to one or more embodiments of the disclosed technology, a display apparatus includes: a display substrate, on which a display unit including a display device is formed, an encapsulation substrate formed to face the display substrate, and a sealing portion surrounding the display unit for bonding the display substrate and the encapsulation substrate to each other. The display apparatus further comprises a first metal line and a second metal line surrounding the display unit. The first metal line and the second metal line may be formed under the sealing portion.

The first metal line may be formed at an inner edge of the sealing portion, the second metal line is formed at an outer edge of the sealing portion, and the first metal line and the second metal line may be separated from each other.

The first metal line and the second metal line may be separated from each other, and at least one of a separation distance between the first metal line and the second metal line and widths of the first and second metal lines may be determined according to an energy distribution of an energy source applied to the sealing portion.

In one exemplary implementation of the display apparatus, the separation distance is determined at least partially based on an intensity of a laser beam.

The sealing portion may further include a sealing material and a bonding layer. The bonding material may be formed between the sealing material and the display substrate.

The bonding layer may have an embossing surface structure.

The bonding layer may include a plurality of first through holes exposing an upper surface of the display substrate.

The bonding layer may include a plurality of first through holes exposing the upper surface of the display substrate in a center portion of the sealing portion.

In one exemplary implementation of the display apparatus, the sealing material is hardened by a laser beam.

In another exemplary implementation of the display apparatus, the sealing material is a frit.

The first metal line and the second metal line may include a plurality of second through holes.

A separation distance between the second through holes may be designed so that an electrostatic discharge may not occur with respect to a predetermined voltage.

The display unit may include a thin film transistor (TFT), the TFT may include an active layer, a gate insulating layer covering the active layer, a gate electrode insulated from the active layer by the gate insulating layer, an interlayer dielectric layer covering the gate electrode, and a source electrode and a drain electrode formed on the interlayer dielectric layer to contact the active layer, and the first metal line and the second metal line may be formed of a material that is the same as at least one of the gate electrode, the source electrode, and the drain electrode at the same layer as at least one of the gate electrode, the source electrode, and the drain electrode.

In one exemplary implementation of the display apparatus, the display device is an organic light emitting device, in which a first electrode, an intermediate layer comprising an organic emission layer, and a second electrode are stacked sequentially.

According to one or more embodiments of the disclosed technology, another display apparatus includes: a display substrate, on which a display unit including a display device is formed, an encapsulation substrate formed to face the display substrate, and a sealing portion surrounding the display unit for bonding the display substrate and the encapsulation substrate to each other, wherein the sealing portion may include: a sealing material that is hardened by a laser beam; a bonding layer formed between the sealing material and the display substrate; and a first metal line and a second metal line formed under the sealing material, wherein the first metal line is formed at an inner edge of the sealing portion and the second metal line is formed at an outer edge of the sealing portion.

The sealing material may be a fit.

The bonding layer may be formed of an insulating material, and may have an embossing surface structure.

The bonding layer may include a plurality of first through holes exposing an upper surface of the display substrate.

In one exemplary implementation of the display apparatus, the upper surface comprises an upper surface of the display substrate in a center portion of the sealing portion.

The first metal line and the second metal line may include a plurality of second through holes.

A separation distance between the second through holes may be designed so that an electrostatic discharge may not occur with respect to a predetermined applied voltage.

The separation distance between the first metal line and the second metal line may be determined according to an intensity of the laser beam.

The display unit may include a thin film transistor (TFT), the TFT may include an active layer, a gate insulating layer covering the active layer, a gate electrode insulated from the active layer by the gate insulating layer, an interlayer dielectric layer covering the gate electrode, and a source electrode and a drain electrode formed on the interlayer dielectric layer to contact the active layer, and the first metal line and the second metal line may be formed of a material that is the same as at least one of the gate electrode, the source electrode, and the drain electrode at the same layer as at least one of the gate electrode, the source electrode, and the drain electrode.

The bonding layer may be formed of a material that is the same as a material of at least one of the gate insulating layer and the interlayer dielectric layer at the same layer as at least one of the gate insulating layer and the interlayer dielectric layer.

The display device may be an organic light emitting device, in which a first electrode, an intermediate layer including an organic emission layer, and a second electrode may be stacked sequentially.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION OF CERTAIN INVENTIVE EMBODIMENTS

Figure 1:
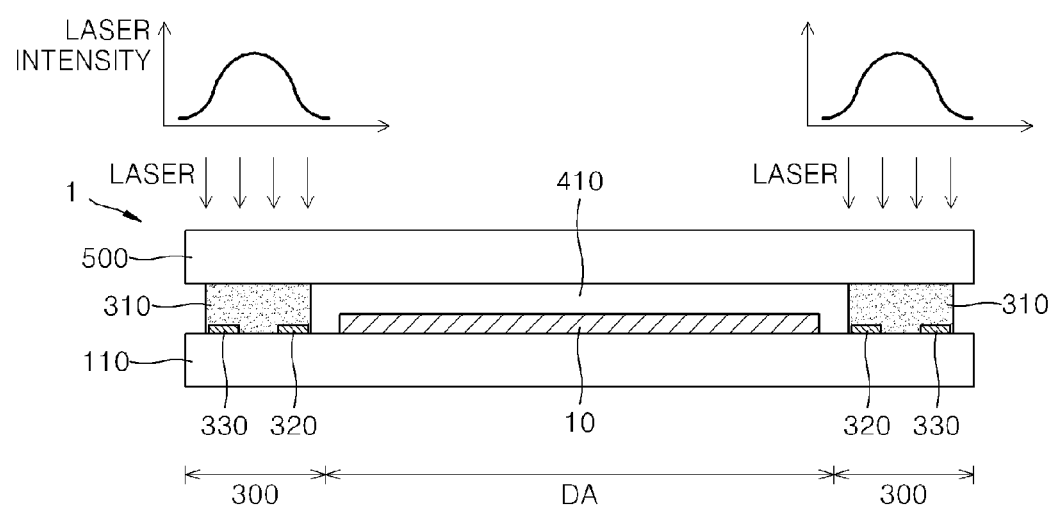
FIG. 1 is a schematic cross-sectional view of a display apparatus according to an exemplary embodiment of the disclosed technology.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

In the following description, technical terms are used only to explain a specific exemplary embodiment while not limiting the disclosed technology. The terms of a singular form may include plural forms unless referred to the contrary. The terms "include," "comprise," "including," and "comprising," as used herein, specify a component, a process, an operation, and/or an element but do not exclude other components, processes, operations, and/or elements. It will be understood that although the terms "first" and "second" are used herein to describe various elements, these elements should not be limited by these terms. These terms are only used to distinguish one component from other components.

It will be understood that when a layer, region, or component is referred to as being "formed on," another layer, region, or component, it can be directly or indirectly formed on the other layer, region, or component. That is, for example, intervening layers, regions, or components may be present.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the disclosed technology is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it is directly on the other element or intervening elements may also be present.

Throughout this specification and the claims that follow, when it is described that an element is "connected" to another element, the element is "directly connected" to the other element or "electrically connected" to the other element through a third element. In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

Here, when a first element is described as being connected to a second element, the first element is not only directly connected to the second element but may also be indirectly connected to the second element via a third element. Further, some of the elements that are not essential to the complete understanding of the disclosed technology are omitted for clarity. Also, like reference numerals refer to like elements throughout.

Figure 2:
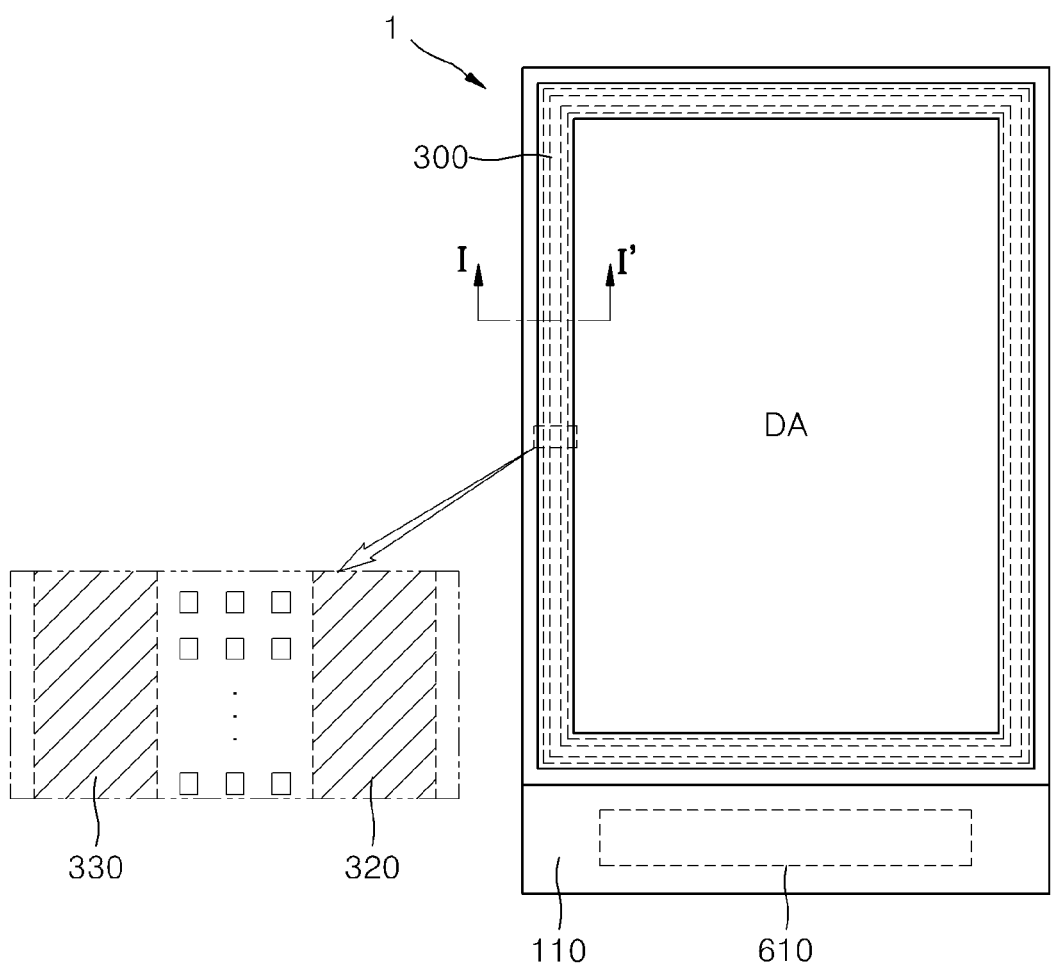
FIG. 2 is a schematic plan view of a display apparatus according to an exemplary embodiment of the disclosed technology.

FIG. 1 is a cross-sectional view of a display apparatus 1 according to an embodiment of the disclosed technology. FIG. 2 is a schematic plan view of the display apparatus 1.

Referring to FIGS. 1 and 2, the display apparatus 1 according to the embodiment of the disclosed technology includes a display substrate 110 on, an encapsulation substrate 500 formed to face the display substrate 110, and a sealing portion 300 for bonding the display substrate 110 and the encapsulation substrate 500 to each other. A display unit 10 formed on the display substrate 110. Also, a first metal line 320 and a second metal line 330 surrounding the display unit 10 are formed under the sealing portion 300. In addition, an integrated circuit chip 510 may be mounted on an edge portion of the display substrate 110, which is not covered by the encapsulation substrate 500.

The display substrate 110 may be formed of a transparent glass material mainly containing $SiO_2$. However, the display substrate 110 according to the embodiments of the disclosed technology is not limited thereto, that is, the display substrate 110 may be formed of various materials such as ceramic, a transparent plastic material, or a metal material.

As shown in FIG. 1, the display unit 10 is formed on the display substrate 110. The display unit 10 may include an array of pixels, each of which may be controlled by a thin film transistor. In one exemplary implementation, the display unit 10 includes one or more display devices.

In some embodiments, the display device may include a thin film transistor (TFT), an organic light emitting device (OLED), and a capacitor Cst. [0061] In some embodiments, the pixels of the display unit 10 respectively include a TFT and a liquid crystal layer controlled by the TFT. In some other embodiments, a backlight overlapping with the display unit 10 may be formed.

The encapsulation substrate 500 may shield the display devices and the like included in the display unit 10 against external moisture and air. A polarization film and/or a color filter may be further formed on the encapsulation substrate 500.

An inner space formed by the display substrate 110, the encapsulation substrate 500, and the sealing portion 300 may be filled with an internal filler 410. The internal filler 410 may protect the display unit 10 against shock that may be applied from outside of the display apparatus 1.

In some embodiments, the internal filler 410 is an organic sealant such as an urethane-based resin, an epoxy-based resin, an acryl-based resin, or an inorganic sealant such as silicon. The urethane-based resin may be urethane acrylate. The acryl-based resin may be butyle acrylate, ethyl hexyle acrylate, and the like.

The sealing portion 300 is a portion where the display substrate 110 and the encapsulation substrate 500 are bonded to each other. and the sealing portion 300 includes the first metal line 320, the second metal line 330, and a sealing material 310. The sealing portion 300 prevents oxygen and moisture from entering the display unit 10. The sealing portion 300 also bonds the display substrate 110 and the encapsulation substrate 500 to each other so as to reinforce a mechanical strength.

The sealing portion 300 may be continuously formed around a peripheral portion of the display unit 10, that is, along edges of the display substrate 110 and the encapsulation substrate 500.

The sealing material 310 may be hardened by a laser beam. The sealing material 310 may also include a fit.

The first and second metal lines 320 and 330 increase an effective seal width of the sealing material 310 by using an energy source of a low intensity and/or allow the sealing material 310 to be uniformly hardened. Here, the effective seal width is a width of the sealing portion that is obtained when the sealing material 310 absorbs a thermal energy. The sealing material 310 may melt and sinter to connect the display substrate 110 and the encapsulation substrate 500 to each other for shielding the oxygen and the moisture of outside.

In general, when the sealing is performed by using a laser beam, the energy of the laser beam has a Gaussian distribution. Therefore, the sealing material 310 may be hardened-non-uniformly due to the energy unevenness between a center and edges of the sealing portion 300.

That is, when irradiating the laser beam, the energy of the laser beam has the highest intensity at the center portion of the sealing portion 300 and the lowest intensity at the edges of the sealing portion 300. Accordingly, the sealing material 310 may be non-uniformly hardened at the center and the edges of the sealing portion 300.

Meanwhile, a metal layer formed under the sealing material 310 absorbs and/or reflects the laser beam to transfer the heat to the sealing material 310, and thereby helping the hardening.

However, when the metal layer is formed throughout the entire lower portion of the sealing material 310, the unevenness of the laser beam may not be compensated for. That is, if the metal layer is formed under the center portion of the sealing portion 300, air pores may be generated on the center portion of the sealing portion 300 due to a difference between expansion and contraction caused due to the inhomogeneous energy, and thereby generating defects in the display apparatus 1.

The first and second metal lines 320 and 330 according to some embodiments of the disclosed technology are formed under the sealing portion 300. The first and second metal lines 320 and 330 may be respectively formed on opposite sides of the sealing portion 300.

That is, the first metal line 320 may be formed on an inner edge of the sealing portion 300 and the second metal line 330 may be formed on an outer edge of the sealing portion 300. The first and second metal lines 320 and 330 may be separated from each other.

Here, the inside of the sealing portion 300 denotes a portion adjacent to the display unit 110 and the outside of the sealing portion 300 denotes a portion apart from the display unit 10.

From another point of view, the first metal line 320 is included in the sealing portion 300 while continuously surrounding the display unit 10. The second metal line 330 is separated from the first metal line 320. The second metal line 330 may be continuously formed while surrounding the first metal line 320.

A distance between the first and second metal lines 320 and 330 and/or a width of each of the first and second metal lines 320 and 330 may be designed according to the energy distribution of a laser beam for hardening the sealing material 310. In some embodiments of the disclosed technology, the widths of the first metal line 320 and the second metal line 330 are about 100 μm to about 250 μm. In addition, in some embodiments, the distance between the first and second metal lines 320 and 330 are about 200 μm to about 500 μm.

Since the first and second metal lines 320 and 330 are not formed under the center portion 300, excessive rising of a temperature on the center portion of the sealing unit 300 may be prevented. Accordingly, the air pores may not be formed in the center portion of the sealing portion 300.

The first and second metal lines 320 and 330 are formed on the edges in the sealing portion 300 so as to compensate for the energy of a laser beam incident to the edges of the sealing portion 300. Accordingly, the effective seal width of the sealing material 310 may be increased and the sealing material 310 may be uniformly hardened.

Figure 3:
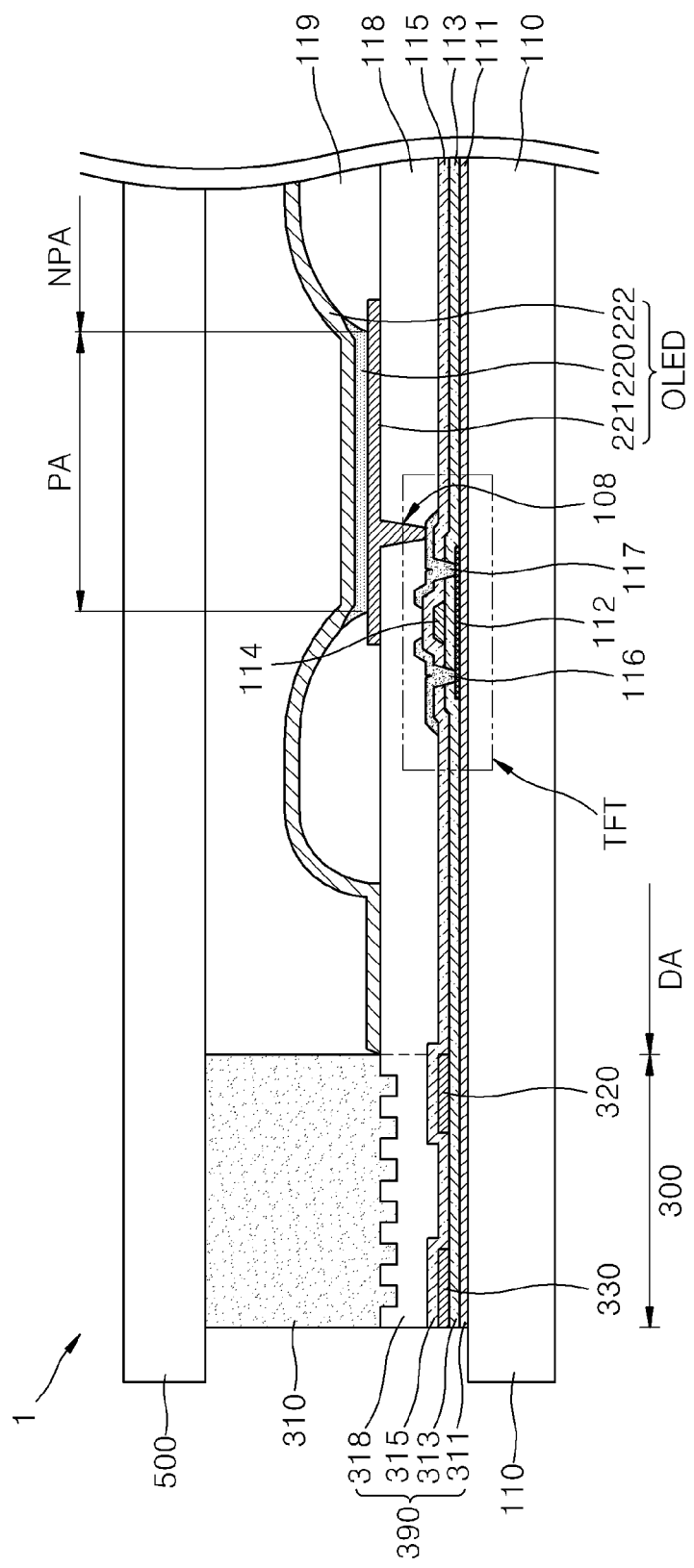
FIG. 3 is a schematic cross-sectional view of the display apparatus taken along line I-I' of FIG. 2.

FIG. 3 is a cross-sectional view of the display apparatus 1 taken along line I-I' of FIG. 2. FIG. 3 shows an organic light emitting display apparatus including an organic light emitting device in the display unit 10 according to one exemplary implementation. However, the embodiments of the disclosed technology are not limited to the organic light emitting display apparatus.

Referring to FIG. 3, the display apparatus 1 includes a display area DA and the sealing portion 300.

The display area DA includes a thin film transistor (TFT) and an organic light emitting device (OLED) formed on the display substrate 110 and/or a buffer layer 111.

The display substrate 110 includes a non-pixel area (NPA) and a plurality of pixel areas PA divided by the non-pixel area NPA. The display substrate 110 may be formed of a transparent glass material containing SiO$_2$ mainly. However, the embodiments of the disclosed technology are not limited thereto, that is, the display substrate 110 may be formed of various materials such as a ceramic material, a transparent plastic material, or a metal material.

The encapsulation substrate 500 is formed to face the display substrate 110, and may seal the OLED between the display substrate 110 and the encapsulation substrate 500 from the external air.

The buffer layer 111 prevents impurity ions from dispersing on an upper surface of the display substrate 110. The buffer layer 111 may prevent the moisture or external area from infiltrating. The buffer layer 111 may also planarizes the surface of the display substrate 110.

The TFT includes an active layer 112, a gate electrode 114, a source electrode 116, and a drain electrode 117. A gate insulating layer 113 is formed between the gate electrode 114 and the active layer 112 for insulating the gate electrode 114 and the active layer 112 from each other.

The active layer 112 may be formed on the buffer layer 111. The active layer 112 may be formed of inorganic semiconductor such as amorphous silicon or polysilicon, or an organic semiconductor. According to some embodiments of the disclosed technology, the active layer 112 is formed of an oxide semiconductor. In one exemplary implementation, the oxide semiconductor includes an oxide material of a material selected from group-12, group-13, and group-14 metal atoms such as zinc (Zn), indium (In), gallium (Ga), tin (Sn), cadmium (Cd), germanium (Ge), hafnium (Hf), and a combination thereof.

The gate insulating layer 113 is formed on the buffer layer 111 to cover the active layer 112. The gate electrode 114 is formed on the gate insulating layer 113. The gate insulating layer 113 is formed of an insulating substance so as to electrically insulate the gate electrode 114 and the active layer 112 from each other. According to some embodiments of the disclosed technology, the gate insulating layer 113 is formed as a single-layered structure of an inorganic material or an organic material, or a stacked structure thereof.

An interlayer dielectric layer 115 is formed on the gate insulating layer 113 to cover the gate electrode 114. The source electrode 116 and the drain electrode 117 are formed on the interlayer dielectric layer 115 to contact the active layer 112 via contact holes.

The TFT is not limited to the above structure, and the TFT may have various structures. In some exemplary implementations, the above-described TFT has a top gate structure; however, the TFT may have a bottom gate structure, in which the gate electrode 114 is formed under the active layer 112.

A pixel circuit (not shown) including the TFT and a capacitor may be formed.

A planarization layer 118 is formed on the interlayer dielectric layer 115 to cover the pixel circuit (not shown) including the TFT. The planarization layer 118 may planarize the surface in order to improve a light emitting efficiency of the OLED formed thereon. The planarization may be formed of an inorganic material and/or an organic material.

The OLED is formed on the planarization layer 118. The OLED includes a first electrode 221, an intermediate layer 220, and a second electrode 222. The intermediate layer 220 may include an organic emission layer.

A pixel defining layer 119 is formed to partially cover the planarization layer 118 and the first electrode 221. The pixel defining layer 119 defines the pixel areas PA and the non-pixel area NPA.

The pixel defining layer 119 may be formed of a resin such as polyacrylates or polyimides, and an inorganic material.

After forming a predetermined opening in the pixel defining layer 119, the intermediate layer 220 of the OLED is formed in a space defined by the opening. In addition, the second electrode 222 of the OLED is formed to cover the entire pixels.

Holes and electrons injected from the first electrode 221 and the second electrode 222 of the OLED may be combined in the organic emission layer to emit light.

The intermediate layer 220 may include the organic emission layer. In some exemplary implementations, the intermediate layer 220 includes the emission layer. The intermediate layer 220 may further include at least one of a hole injection layer (HIL), a hole transport layer (HTL), an electron transport layer (ETL), and an electron injection layer (EIL). However, the embodiments of the disclosed technology are not limited thereto, that is, the intermediate layer 220 includes the organic emission layer, and may further include other various functional layers.

The second electrode 222 is formed on the intermediate layer 220. The second electrode 222 forms an electric field with the first electrode 221 so that the intermediate layer 220 emits light. The first electrode 221 may be patterned to correspond to each of the pixels. The second electrode 222 may be formed to apply a common voltage to the entire pixels.

The first electrode 221 and the second electrode 222 may be formed as transparent electrodes or reflective type electrode. The first electrode 221 may function as an anode electrode and the second electrode 222 may function as a cathode electrode. However, the embodiments of the disclosed technology are not limited thereto. The first electrode 221 may function as a cathode and the second electrode 222 may function as an anode electrode.

Although only one OLED is shown in FIG. 3, an organic emission unit 22 (refer to FIG. 1) may include a plurality of OLEDs. Each of the OLEDs may form one pixel, and each of the pixels may emit red, green, blue, or white light.

However, according to embodiments of the disclosed technology, the intermediate layer 220 is formed commonly throughout the entire first electrode 221 without regard to the pixels. Here, the organic emission layer may be formed by vertically stacking layers including light emitting materials emitting red, green, and blue light or by mixing the light emitting materials emitting the red, green, and blue light. Other materials emitting different colors of light may be used, provided that white light may be emitted.

Also, a color conversion layer for converting white light into a predetermined color or a color filter may be further formed.

A protective layer (not shown) may be formed on the second electrode 222 and cover the OLED to protect the OLED. The protective layer (not shown) may be formed of an inorganic insulating layer and/or an organic insulating layer.

The sealing portion 300 is a portion where the display substrate 110 and the encapsulation substrate 500 are bonded to each other. The sealing portion 300 includes the sealing material 310, the first metal line 320, and the second metal line 330. The sealing portion 300 may further include a bonding layer 390.

The sealing material 310, the first metal line 320, and the second metal line 330 may be formed while surrounding the display area DA of the display substrate 110 (see FIG. 2). In some exemplary implementations, the sealing material 310 is an inorganic material frit.

The sealing material 310 may be formed by being applied by a dispenser or a screen printing method. The frit generally refers to a glass material of powder type; however, the frit may also refer to a paste state including a main material such as SiO$_2$, a laser or infrared ray absorbent, an organic binder, and a filler for reducing a thermal expansion coefficient. The frit of a paste phase may be hardened through a drying or a baking process performed to remove the organic binder and moisture. The laser or infrared ray absorbent may include a transition metal compound. A heat source for hardening the sealing material 310 and bonding the display substrate 110 and the encapsulation substrate 500 to each other may be a laser beam.

The first metal line 320 and the second metal line 330 allow the sealing material 310 to be uniformly hardened. The first metal line 320 and the second metal line 330 may increase the effective seal width of the sealing material 310 by using a low energy intensity, as described above.

The first and second metal lines 320 and 330 absorb or reflect the laser beam irradiated to harden the sealing material 310 in order to transfer heat to the sealing material 310.

The first and second metal lines 320 and 330 may be formed at the same layer as those of various wirings connected to the display unit 10 to drive the display unit 10.

In some embodiments, the first and second metal lines 320 and 330 are formed of the same material at the same layer as at least one of the gate electrode 114, the source electrode 116, the drain electrode 117, the first electrode 221, and the second electrode 222 of the display area DA.

The bonding layer 390 may reinforce a bonding force between the display substrate 110 and the sealing material 310. The bonding layer 390 may be formed of a material having a large interface adhesive strength with the sealing material 310. According to some embodiments of the disclosed technology, the bonding layer 390 is formed of an insulating material.

The bonding layer 390 may have an irregular or embossing surface shape. Accordingly, a contact area between the bonding layer 390 and the sealing material 310 may increase the bonding force between the display substrate 110 and the sealing material 310. A mechanical strength of the display apparatus 1 may be improved, and an isolation caused by external shock may be prevented.

The bonding layer 390 may include a single-layered or a multi-layered insulating layer. According to some embodiments of the disclosed technology, the bonding layer 390 includes a first insulating layer 311, a second insulating layer 313, a third insulating layer 315 and a fourth insulating layer 318. The first insulating layer 311 may be formed of the same material at the same layer as those of the buffer layer 111, and the second insulating layer 313 may be formed of the same material at the same layer as those of the gate insulating layer 113. In addition, the third insulating layer 315 may be formed of the same material at the same layer as those of the interlayer dielectric layer 115. The fourth insulating layer 318 may be formed of the same material at the same layer as those of the planarization layer 118. The fourth insulating layer 118 may be omitted.

However, the embodiments of the disclosed technology are not limited thereto, that is, the insulating layers forming the bonding layer 390 may be separately formed from the insulating layers configuring the display area DA. In addition, at least one of the first insulating layer 311, the second insulating layer 313, the third insulating layer 315, and the fourth insulating layer 318 may be omitted.

The bonding layer 390 may be formed on and/or under the first metal line 320 and the second metal line 330. According to some embodiments of the disclosed technology, the first insulating layer 311 and the second insulating layer 313 of the bonding layer 390 are formed under the first and second metal lines 320 and 330. The third insulating layer 315 and the fourth insulating layer 318 may be formed on the first and second metal lines 320 and 330.

For forming the bonding layer 390, the first metal line 320, and the second metal line 330, the first insulating layer 311, the second insulating layer 313, a preliminary metal line (not shown), the third insulating layer 315, and/or the fourth insulating layer 318 are sequentially stacked on the display substrate 110. The first metal line 320 and the second metal line 330 may be formed by forming one preliminary metal line (not shown) on an entire lower surface of the sealing material 310, and patterning the preliminary metal line.

The first, second, third, and fourth insulating layers 311, 313, 315 and 318 may be formed by using various methods that are known as general thin film growth methods an epitaxial deposition method, a metal organic chemical vapor deposition (MOCVD) method, a hybrid vapor phase epitaxy (HVPE) method, a molecular beam epitaxy (MBE) method, a metal organic vapor phase epitaxy (MOVPE) method, a halide chemical vapor deposition (HCVD) method, a sputtering method, an atomic layer deposition (ALD) method, and a plasma enhanced CVD (PECVD) method.

In some embodiments of the disclosed technology, the first insulating layer 311 is formed simultaneously with the buffer layer 111 of the display area DA. The second insulating layer 313 may be simultaneously formed with the gate insulating layer 113. Also, the third insulating layer 315 may be formed simultaneously with the interlayer dielectric layer 115, and the fourth insulating layer 318 may be formed simultaneously with the planarization layer 118. The first and second metal lines 320 and 330 may be formed simultaneously with the gate electrode 114.

After that, the upper surface of the bonding layer 390 is partially etched to form an irregular surface structure. According to the present embodiment, in order to form the irregular surface structure, a plurality of photoresist (PR) patterns are formed on the stacked structure by using a photolithography process, and the upper surface of the bonding layer 390 is etched by using the PR patterns as an etching mask. The etching process may be a dry etching, a wet etching, or an etching method combining the same.

Figure 4A:
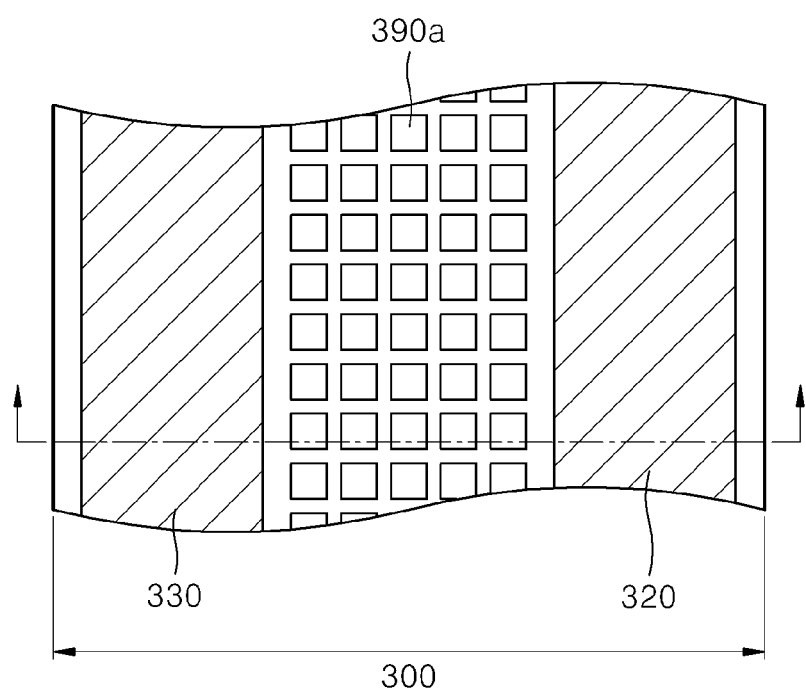
FIG. 4A is a plan view of a sealing portion according to another exemplary embodiment of the disclosed technology.
Figure 4B:
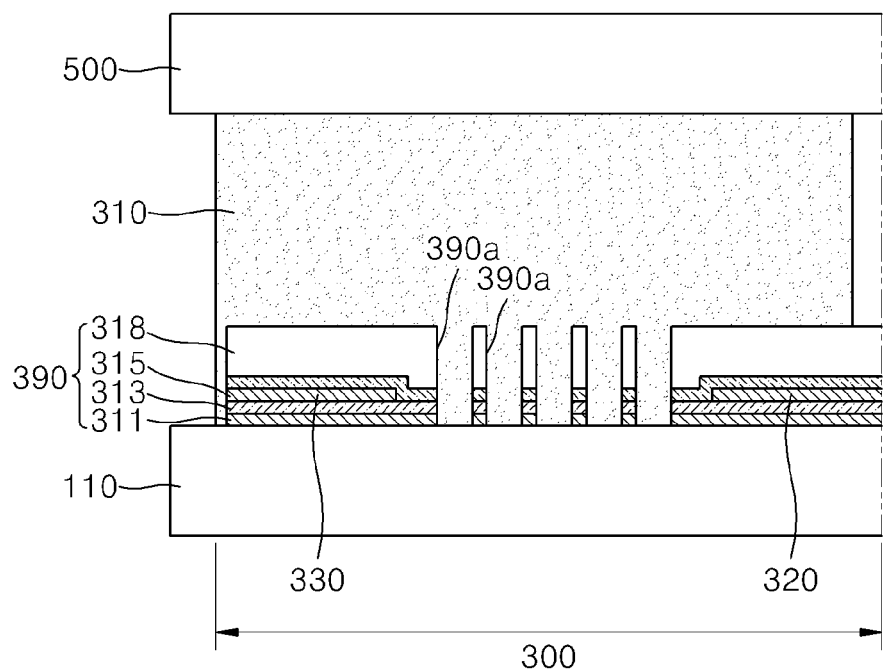
FIG. 4B is a cross-sectional view of the sealing portion shown in FIG. 4A.

FIG. 4A is a plan view of the sealing portion 300 according to another embodiment of the disclosed technology. FIG. 4B is a cross-sectional view of the sealing portion 300 of FIG. 4A. In FIGS. 4A and 4B, the same reference numerals as those of FIG. 3 denote the same elements, and detailed descriptions thereof are omitted for convenience of description.

Referring to FIGS. 4A and 4B, the sealing portion 300 includes the sealing material 310, the first metal line 320, the second metal line 330 formed on opposite edges, and the bonding layer 390. The first metal line 320 and the second metal line 330 are formed on opposite edges. The bonding layer 390 has an irregular or embossing surface structure.

The bonding layer 390 shown in FIGS. 4A and 4B includes a plurality of first through holes 390a to configure the irregular surface structure. Accordingly, when a contact area between the sealing material 310 and the bonding layer 390 increases, the adhesive strength may be further increased.

The first through holes 390a expose the upper surface of the display substrate 110 so that the sealing material 310 may directly contact the display substrate 110. Accordingly, the bonding between the sealing material 310 and the display substrate 110 may be reinforced. In some exemplary implementations, if the frit is used as the sealing material 310 and the display substrate 110 is formed of a glass material, both contains the glass component, the bonding force may be further improved.

Although the first through holes 390a are shown to be formed in the center portion of the sealing portion 300, the embodiments of the disclosed technology are not limited thereto. The first through holes 390a may exist in the edges of the sealing portion 300, as well as the center portion of the sealing portion 300.

In order to form the first through holes 390a, a plurality of PR patterns are formed on the stacked structure by using a photolithography process, and the stacked structure is etched to form the first through holes 390a by using the PR patterns as an etching mask. The etching process may use a dry etching, a wet etching, or a combination thereof.

Figure 5A:
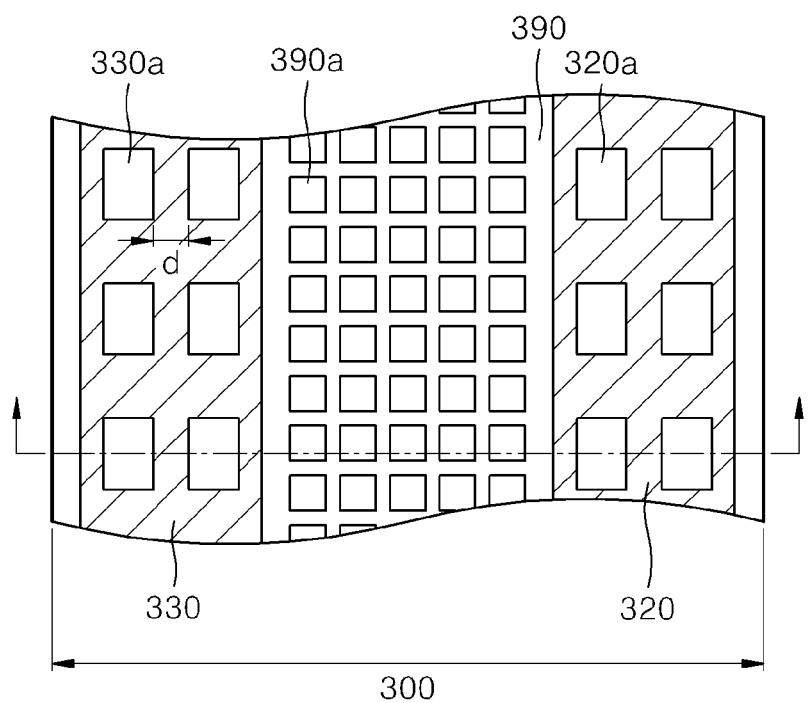
FIG. 5A is a plan view of a sealing portion according to another exemplary embodiment of the disclosed technology.
Figure 5B:
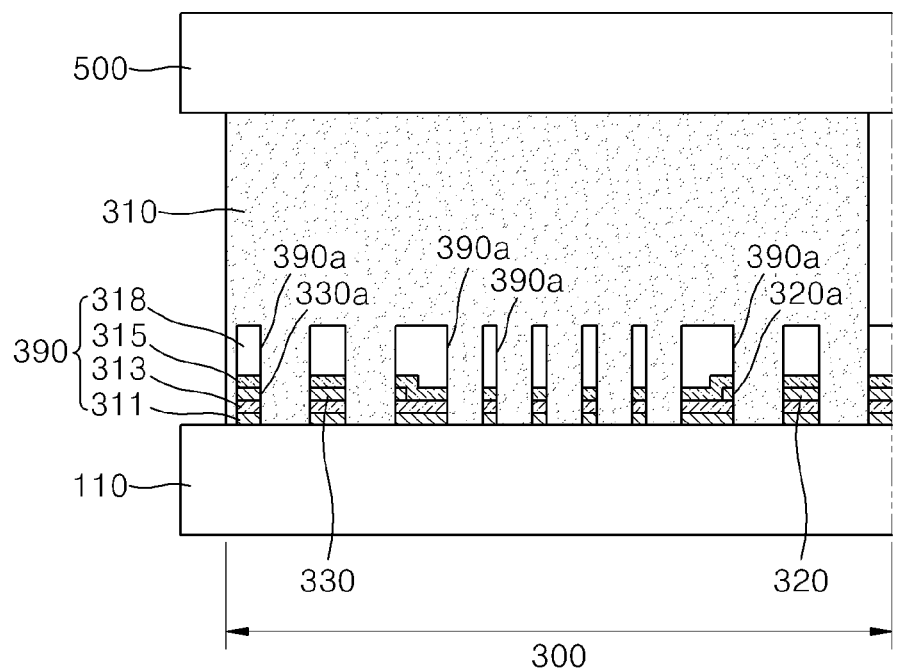
FIG. 5B is a cross-sectional view of the sealing portion of FIG. 5A.

FIG. 5A is a plan view of the sealing portion 300 according to another embodiment of the disclosed technology. FIG. 5B is a cross-sectional view of the sealing portion 300 of FIG. 5A. In FIGS. 5A and 5B, the same reference numerals as those of FIG. 3 denote the same elements, and detailed descriptions are omitted for convenience of description.

Referring to FIGS. 5A and 5B, the sealing portion 300 includes the sealing material 310, the first metal line 320, the second metal line 330 and the bonding layer 390. The first metal line 320 and the second metal line 330 are formed at opposite edges of the sealing portion 300. The bonding layer 390 has an irregular surface structure.

The first metal line 320 and the second metal line 330 shown in FIGS. 5A and 5B respectively include a plurality of second through holes 320a and 330a. The second through holes 320a and 330a penetrate through the first metal line 320 and the second metal line 330. The second through holes 320a and 330a are distinguished from the first through holes 390a that penetrate through the bonding layer 390.

The second through holes 320a and 330a may be connected to the first through holes 390a of the bonding layer 390. Accordingly, the upper surface of the display substrate 110 may be exposed. However, the embodiments of the disclosed technology are not limited thereto, that is, the second through holes 320a and 330a may only expose the bonding layer 390 existing under the first and second metal lines 320 and 330. According to some embodiments of the disclosed technology, the second through holes 320a and 330a expose an upper surface of the second insulating layer 313 or the first insulating layer 311.

A distance between the second through holes 320a and 330a may be designed to possibly cause an electrostatic discharge (ESD). The first metal line 320 and the second metal line 330 may be elements for protecting the display apparatus 1 against the ESD.

The ESD is a discharging phenomenon that a finite amount of charges caused by a static electricity rapidly move between two materials having different electric potentials. The OLED may be broken due to internal defects in the OLED caused by the external static electricity.

If the second through holes 320a and 330a in the first and second metal lines 320 and 330 are formed densely, arc may be generated due to the ESD. That is, the distances d between the second through holes 320a and 330a have to be a predetermined gap or greater so that the charges existing in the first and second metal lines 320 and 330 may sufficiently move to a ground.

That is, the distance between two adjacent second through holes 320a and 330a may be designed so as not to generate the ESD with respect to a constant external voltage.

According to some embodiments of the disclosed technology, the distance d between the second through holes 320a and 330a is designed so as not to generate the ESD with respect to an ESD applied voltage of about 10 kV or greater.

That is, the distance d between the second through holes 320a and 330a may be about 15 μm or greater.

Figure 7:
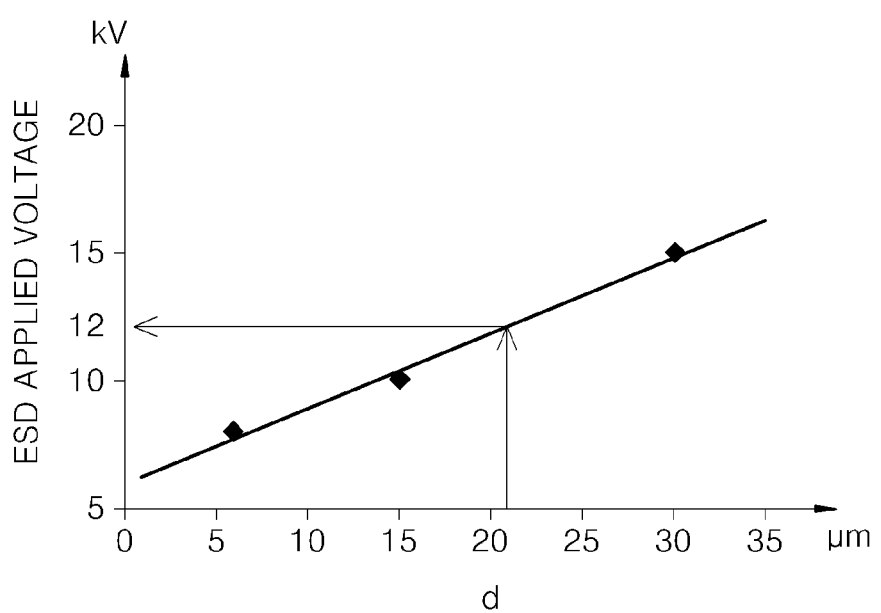
FIG. 7 is a diagram showing data for designing a distance d so as not to generate an electrostatic discharge (ESD) with respect to a constant ESD applied voltage.

FIG. 7 shows data for designing the distance d so as not to generate the ESD with respect to a constant ESD applied voltage.

Referring to FIG. 7, minimum ESD applied voltages that do not generate the ESD are shown according to the distance d between the second through holes 320a and 330a. Accordingly, relations between the distance d and the ESD applied voltage may be obtained. The distance d may be designed according to the reference ESD applied voltage.

According to some embodiments of the disclosed technology, the distance d is designed to be 20.5 μm or greater so that the ESD may not be generated with respect to the ESD applied voltage of 12 kV.

Referring back to FIGS. 5A and 5B, since the first metal line 320 and the second metal line 330 include the second through holes 320a and 330a so that the sealing material 310 and the display substrate 110 may be coupled firmly to each other. Also, the distance d between two adjacent second through holes 320a and 330a may be designed in consideration of the ESD and the display apparatus 1 may be protected against the ESD.

Figure 6A:
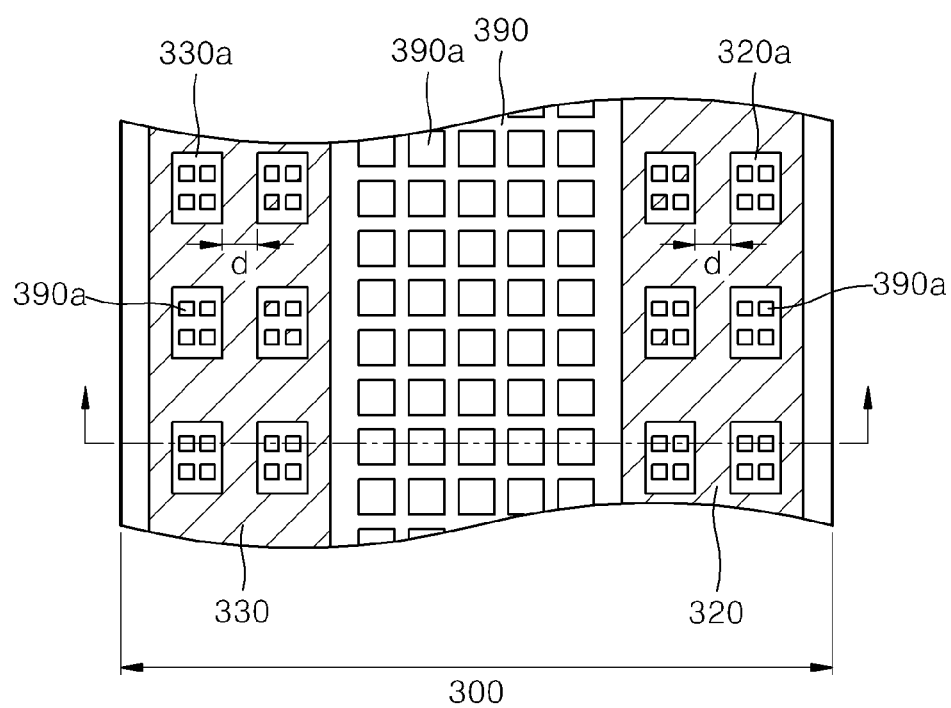
FIG. 6A is a plan view of a sealing portion according to another exemplary embodiment of the disclosed technology.
Figure 6B:
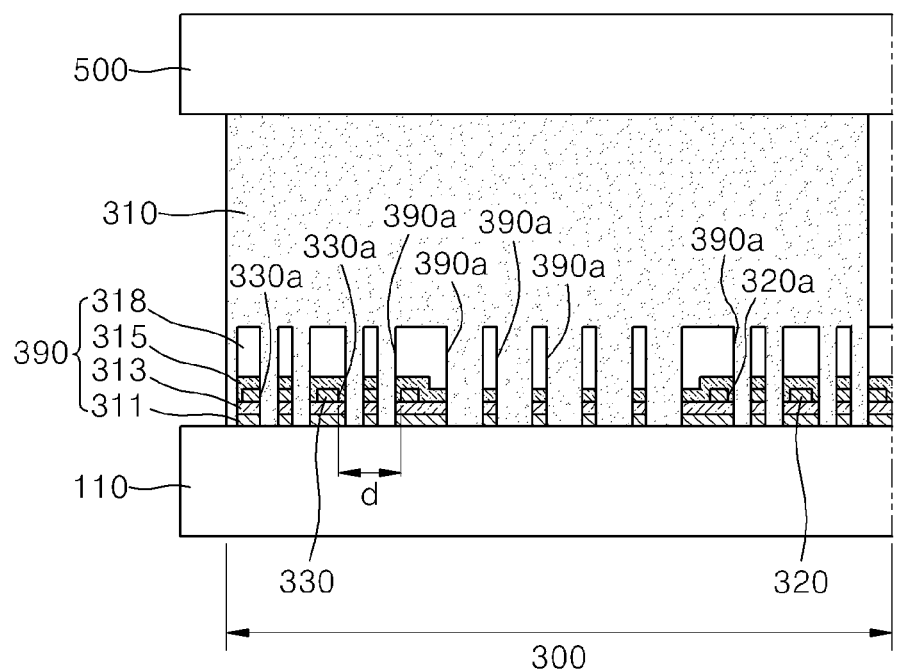
FIG. 6B is a cross-sectional view of the sealing portion of FIG. 6A.

FIG. 6A is a plan view of the sealing portion 300 according to another embodiment of the disclosed technology. FIG. 6B is a cross-sectional view of the sealing portion 300 of FIG. 6A. In FIGS. 6A and 6B, the same reference numerals as those of FIG. 5 denote the same elements, and detailed descriptions thereof are omitted for convenience of description.

Referring to FIGS. 6A and 6B, the sealing portion 300 includes the sealing material 310, the first metal line 320, the second metal line 330, and the bonding layer 390. The first metal line 320 and the second metal line 330 are formed at the opposite edges of the sealing portion 300. The bonding layer 300 has an irregular surface structure.

Referring to FIGS. 6A and 6B, the second through holes 320a and 330a formed in the first and second metal lines 320 and 330 may include a plurality of first through holes 390a of the bonding layer 390. Thus, the distance between the second through holes 320a and 330a is maintained, and at the same time, a contact area between the sealing material 310 and the bonding layer 390 and/or the upper substrate of the display substrate 110. However, the embodiments of the disclosed technology are not limited thereto, that is, the sealing portion 300 may be variously modified in order to increase the contact area between the sealing material 310 and the bonding layer 390 and/or the upper surface of the display substrate 110.

Figure 8:
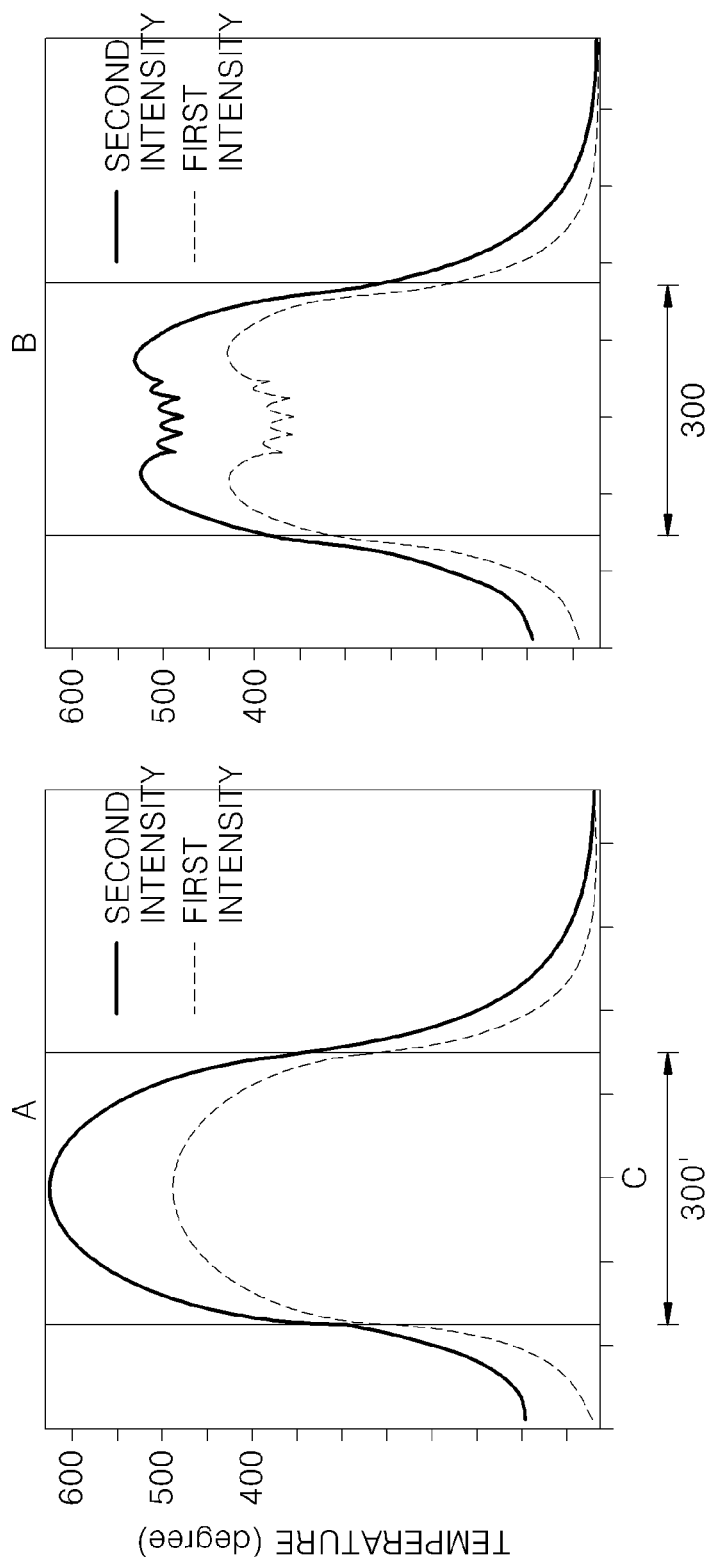
FIGS. 8A and 8B are graphs showing a temperature of an encapsulation substrate when a laser beam is applied to a sealing portion.

FIGS. 8A and 8B are graphs showing a temperature of the encapsulation substrate 500 when a laser beam is applied to the sealing portion 300.

FIG. 8A shows a case where the metal layer is entirely formed under a sealing portion 300', and FIG. 8B shows a case where the sealing portion 300 according to the present embodiment is used.

Referring to FIGS. 8A and 8B, a temperature difference between the center portion and the edges of the sealing portion 300 according to the present embodiment is less than that of the sealing portion 300', under which the metal layer is entirely formed.

According to the sealing portion 300 of the embodiments of the disclosed technology, the temperature may be uniformly applied to the sealing material 310 when irradiating the laser beam, and thus, the sealing material 310 may be uniformly hardened.

As described above, according to the one or more of the above embodiments of the disclosed technology, the first metal line and the second metal line are respectively formed at the inner and outer edges of the sealing portion, and thus, the bonding strength may be increased and the sealing may be performed uniformly.

For purposes of summarizing the disclosed technology, certain aspects, advantages and novel features of the disclosed technology have been described herein. It is to be understood that not necessarily all such advantages is achieved in accordance with any particular embodiment of the disclosed technology. Thus, the disclosed technology is embodied or carried out in a manner that achieves or optimizes one advantage or group of advantages as taught herein without necessarily achieving other advantages as is taught or suggested herein.

Various modifications of the above described embodiments will be readily apparent, and the generic principles defined herein is applied to other embodiments without departing from the spirit or scope of the disclosed technology. Thus, the disclosed technology is not intended to be limited to the embodiments shown herein but is to be accorded the widest scope consistent with the principles and novel features disclosed herein.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the disclosed technology have been described with reference to the figures, it will be understood by those of ordinary skill in the art that various changes in form and details may be made therein without departing from the spirit and scope of the disclosed technology as defined by the following claims.

What is claimed is:

1. A display apparatus, comprising:
  a display substrate on which a display unit including a display device is formed;
  an encapsulation substrate formed to face the display substrate;
  a sealing portion configured to surround the display unit and bond the display substrate and the encapsulation substrate to each other; and
  a metal layer formed under the sealing portion;
  wherein the sealing portion includes an inner edge adjacent to the display unit, an outer edge opposite the inner edge, and a center portion between the inner edge and the outer edge;
  wherein the metal layer comprises:
    a first metal line adjacent to the inner edge and extending below a first portion of the sealing portion;
    a second metal line adjacent to the outer edge and extending below a second portion of the sealing portion; and
    an opening between the first metal line and the second metal line such that no metal line is located in the opening between the first metal line and the second metal line, and wherein the opening extends along the sealing member to surround the display unit.

2. The display apparatus of claim 1, wherein the first metal line is formed at an inner edge of the sealing portion, wherein the second metal line is formed at an outer edge of the sealing portion, and wherein the first metal line and the second metal line are separated from each other.

3. The display apparatus of claim 1, wherein the first metal line and the second metal line are separated from each other, and wherein at least one of a separation distance between the first metal line and the second metal line and widths of the first and second metal lines is determined based on an energy distribution of an energy source applied to the sealing portion.

4. The display apparatus of claim 3, wherein the separation distance is determined at least partially based on the intensity of a laser beam.

5. The display apparatus of claim 1, wherein the sealing portion further comprises a sealing material and a bonding layer, and wherein the bonding layer is formed between the sealing material and the display substrate.

6. The display apparatus of claim 5, wherein the bonding layer comprises an embossing surface structure.

7. The display apparatus of claim 5, wherein the bonding layer comprises a plurality of first through holes exposing an upper surface of the display substrate.

8. The display apparatus of claim 7, wherein the upper surface comprises an upper surface of the display substrate in a center portion of the sealing portion.

9. The display apparatus of claim 5, wherein the sealing material is hardened by a laser beam.

10. The display apparatus of claim 5, wherein the sealing material is a fit.

11. The display apparatus of claim 1, wherein the first metal line and the second metal line comprise a plurality of second through holes.

12. The display apparatus of claim 11, wherein a separation distance between the second through holes is designed so that an electrostatic discharge may not occur with respect to a predetermined voltage.

13. The display apparatus of claim 1, wherein the display unit comprises a thin film transistor (TFT),
  the TFT comprises an active layer, a gate insulating layer covering the active layer, a gate electrode insulated from the active layer by the gate insulating layer, an interlayer dielectric layer covering the gate electrode, and a source electrode and a drain electrode formed on the interlayer dielectric layer to contact the active layer,
  and the first metal line and the second metal line are formed of a material that is the same as at least one of the gate electrode, the source electrode, and the drain electrode at the same layer as at least one of the gate electrode, the source electrode, and the drain electrode.

14. The display apparatus of claim 1, wherein the display device is an organic light emitting device, in which a first electrode, an intermediate layer comprising an organic emission layer, and a second electrode are stacked sequentially.

15. A display apparatus, comprising:
  a display substrate on which a display unit including a display device is formed;
  an encapsulation substrate formed to face the display substrate; and
  a sealing portion configured to surround the display unit and bond the display substrate and the encapsulation substrate to each other,
  wherein the sealing portion comprises:
    a sealing material that is hardened by a laser beam,
    a bonding layer formed between the sealing material and the display substrate, and
    a metal layer formed under the sealing portion,
    wherein the sealing portion includes an inner edge adjacent to the display unit, an outer edge opposite to the inner edge, and a center portion between the inner edge and the outer edge,
  wherein the metal layer comprises:
    a first metal line adjacent to the inner edge and extending below a first portion of the sealing portion, a second metal line adjacent to the outer edge and extending below a second portion of the sealing portion, and an opening between the first metal line and the second metal line such that no metal line is located in the opening between the first metal line and the second metal line, and wherein the opening extends along the sealing member to surround the display unit.

16. The display apparatus of claim 15, wherein the sealing material is a frit.

17. The display apparatus of claim 15, wherein the bonding layer is formed of an insulating material, and has an embossing surface structure.

18. The display apparatus of claim 15, wherein the bonding layer comprises a plurality of first through holes exposing an upper surface of the display substrate.

19. The display apparatus of claim 18, wherein the upper surface comprises an upper surface of the display substrate in a center portion of the sealing portion.

20. The display apparatus of claim 15, wherein the first metal line and the second metal line comprises a plurality of second through holes.

\* \* \* \* \*